United States Patent [19]

Maegawa et al.

[11] Patent Number: 4,710,895
[45] Date of Patent: Dec. 1, 1987

[54] MAGNETIC BUBBLE MEMORY MODULE WITH PROTECTED TERMINALS

[75] Inventors: Harumi Maegawa; Sakan Takai, both of Kawasaki; Toshiaki Sukeda, Suzaka; Shoji Irie, Nagano; Shoichi Kobata, Yokohama, all of Japan

[73] Assignee: Fujitsu Limited, Kawasaki, Japan

[21] Appl. No.: 731,487

[22] Filed: May 7, 1985

[30] Foreign Application Priority Data

May 7, 1984 [JP] Japan .................................. 59-91457

[51] Int. Cl.⁴ ............................................. G11C 19/08
[52] U.S. Cl. ..................................................... 365/2
[58] Field of Search ................................................. 365/2

[56] References Cited

U.S. PATENT DOCUMENTS 4,180,863  12/1979  Joshi ......................................... 365/2
4,414,646  11/1983  Bountin et al. ........................... 365/2
4,459,680   7/1984  Sukeda et al. ........................... 365/1
4,592,014   5/1986  Akiba et al. .............................. 365/2

Primary Examiner—James W. Moffitt
Attorney, Agent, or Firm—Staas & Halsey

[57] ABSTRACT

A magnetic bubble memory module containing a magnetic bubble memory device and its analog peripheral circuits mounted on a substrate, having outer input/output lead terminals, allowing the module to be mounted on a conventional printed circuit board instantaneously with other electronic elements. Lead terminals of the magnetic bubble memory device are protected by a protection means of an insulator such as plastic material, so that the magnetic bubble memory device is protected from the electrostatic discharge damage caused by the touching of a charged body such as human fingers. This results in high reliability and high production yield of the magnetic bubble memory apparatus.

12 Claims, 12 Drawing Figures

MAGNETIC BUBBLE MEMORY MODULE WITH PROTECTED TERMINALS

BACKGROUND OF THE INVENTION

The present invention relates to a magnetic bubble memory apparatus. More particularly, it relates to the construction of a module including a magnetic bubble memory device and its analog peripheral circuits, which are easily mountable on a printed circuit board of a storage apparatus.

A semiconductor memory device such as an integrated circuit (IC) memory device plays a major role as a storage apparatus of large capacity used for an electronic apparatus such as a computer. However, because of the volatility of the storage, an auxiliary storage is indispensable so that the data can be sheltered and maintained before operation is resumed after a power down. On the contrary, a magnetic bubble memory device is a non-volatile memory device that is capable of storing data information without a power supply. In addition, the magnetic bubble memory device has many advantages such as an easy rewriting function, high reliability due to having no moving elements, compact size, a structure that is suitable for mounting onto a printed circuit board, etc. As such, the field of application of magnetic bubble memory devices has been increasing. Particularly, the magnetic bubble memory device is applicable to file memories and program loaders for various apparatuses, such as numerical control (NC) devices, robots, production control terminals, point-of-sales (POS) terminals, office automation (OA) apparatus, and the like. The constitution and operation of the magnetic bubble memory apparatuses are wellknown, but will be described briefly hereinafter to clarify the advantages of the present invention over those of the prior art.

A magnetic bubble memory device comprises substrate consisting of a magnetic garnet single crystal film epitaxially grown on a non-magnetic garnet substrate (a gadolinimium-galliumgarnet, GGG, substrate), and a transfer circuit, generator circuit and detector circuit as well as means for retaining and transferring the magnetic bubbles which are formed on the single crystal film.

Generally, a magnetic bubble memory device has a structure as shown in the perspective view of FIG. 1, comprising a memory chip 102 mounted on an insulator substate 101, an X-Y coil 103, permanent magnet plates referred as bias magnets 104, ferrite yokes 105, lead terminals 106, and a shield case 107. The X-Y coil 103 generates a rotating magnetic field which is applied to the memory chip 102 to transfer magnetic bubbles stored in the chip 102. The bias magnets 104 and the ferrite yokes 105 apply a bias magnetic field to the memory chip 102 in order to retain the magnetic bubbles therein. The lead terminals 106 connect the magnetic bubble chip 102 to associated peripheral circuits for controlling the bubble movement and for feeding out the output signals. The entire device is accommodated in a shield case 107.

FIG. 2 illustrates a schematic plan view of a pattern configuration formed on a magnetic bubble memory chip 102. On a magnetic garnet crystal film grown epitaxially on a non-magnetic garnet substrate (not shown), various elements are formed: a bubble generator 111 coupled with a write-in major line 112, a large number of minor loops 113 for storing information and a read-out major line 114, wherein both the write-in and read-out major lines 112, 114 couple with the minor loops 113. The major lines 112 and 114, and the minor loops 113, are composed of a series of conductor patterns, such as half disk-shaped patterns, as an example. The conductor patterns are formed of iron-nickel alloy (Permalloy) having a high magnetic permeability by a conventional film forming method, and the magnetic bubbles are transferred therethrough and stored therein. A group of signals stored in the patterns located on a horizontal line (shown in FIG. 2 by the dotted line A—A) is referred as a page.

When write-in signals are input to the bubble generator 111, bubble signals are generated therein and, under the control of swap-gate 115, bubble signals are transferred in sequence so as to compose a page, which is transferred through the major line 112 to a minor loop 113 by driving the X-Y coil 103.

When read-out signals are input, the stored information signals in the form of magnetic bubbles are copied by a replicate gate 116 and transferred to a detector 117 which is made of Permalloy. Accordingly, the information signals are converted to current signals by utilizing the magnetoresistance effect of Permalloy, namely by detecting the difference of resistance of respective Permalloy patterns. The current signals are amplified and converted to a TTL (transistor-transistor logic) level by a sense amplifier (not shown). A boot loop 119, a boot swap gate 120 and a boot replicate gate 121 provide information with regards to inherent defects of the minor loops 113 to skip these defects during write-in and read-out operations.

These gates are driven by respective analog drivers, the analog circuits of which require analog technology for their design. These analog circuits comprise function drivers, a coil driver and a sense amplifier. These circuits are referred to as analog peripheral circuits. On the other hand, a magnetic bubble memory apparatus has a group of digital circuits that are referred to as digital peripheral circuits and which provide digital signals to control the analog circuits according to write-in signals or read-out signals provided by an exterior controlling circuit.

As described above, a magnetic bubble memory apparatus comprises magnetic bubble memory devices, analog peripheral circuits and digital peripheral circuits, which are usually mounted on a printed circuit board. As a result, the magnetic bubble memory apparatus is to be built into a user's apparatus as its storage unit, utilizing electrical connecting means such as connectors and mechanical fixing means such as fixing frames. It is desirable to mount a magnetic bubble memory apparatus in a module type container onto a printed circuit board without such connectors and fixing frames. Recently, users tend to demand a magnetic bubble memory device which can be handled for mounting on a printed circuit board in the same manner as other electronic elements, to obtain freedom of design and ease of mounting.

SUMMARY OF THE INVENTION

It is an object of the present invention to provide a magnetic bubble memory in the form of a module mountable on a storage device as a non-volatile memory unit.

It is another object of the present invention to provide a magnetic bubble memory module having outer lead terminals by which the module is mountable on an ordinary printed circuit board in a way similar to how ICs are mounted, and, more particularly, having means for protecting a magnetic bubble memory device accommodated therein from electrostatic discharge damage caused by the touch of a charged body such as of the operator.

It is still another object of the present invention to provide a magnetic bubble memory module comprising associated analog peripheral circuits, so that users can handle the module without requiring design skill concerning analog circuits.

The magnetic bubble memory module according to the present invention comprises magnetic bubble memory devices and analog peripheral circuits. The outer size of the module is minimized to realize a high packing density of the apparatus into which the module is built. The output and input terminals, and the outer lead terminals, connecting the module to its digital peripheral circuits, are of the conventional type as in a packaged IC, that is, they are arranged in lines so that the module can be mounted onto a printed circuit board by dip-soldering, and by instantaneously soldering other electrical elements such as ICs, resistors and the like. This provides an apparatus designer with a lot of freedom and flexibility of design. In addition, design knowledge of analog circuitry is not required of the designer, who is usually familiar with the design of digital circuits but not of analog circuits.

In addition, for operators in a production line, a magnetic bubble memory module by the present invention provides an easy-to-handle advantage obtained by using a protecting insulator cover or a protector, for preventing the lead terminals of the magnetic bubble device from electrostatic discharge damage caused by being touched by the fingers of an operator or by any other charged body. Generally, the data stored in a magnetic bubble memory device can be easily damaged by an electrostatic discharge. Particularly, if the boot loop information stored in a boot loop for indicating the defects in the minor loops is disturbed, the whole module becomes unavailable. The lead terminals of the magnetic bubble memory device are carefully covered or protected by a plastic cover or by projections, so that the terminals are protected from any electrostatic discharge damage.

Furthermore, the substrate of the module is reinforced by a plastic frame surrounding the edge of the substrate and to which it is adhered by the aid of plastic adhesion material. In addition, heat sinks are arranged on the surface of the module supported by the plastic frame to dissipate heat generated in the coil driver and in function drivers which are mounted on a front surface of the substrate (a printed circuit board) of the module.

It is obvious to those skilled in the art that these features of the present invention are not always employed instantaneously, but are generally applicable in part depending on the design of the relevant magnetic bubble memory module. The features and advantages will be apparent from the subsequent description of embodiments of the present invention with reference to the accompanying drawings and from the claims.

DESCRIPTION OF THE PREFERRED EMBODIMENTS

Figure 1:
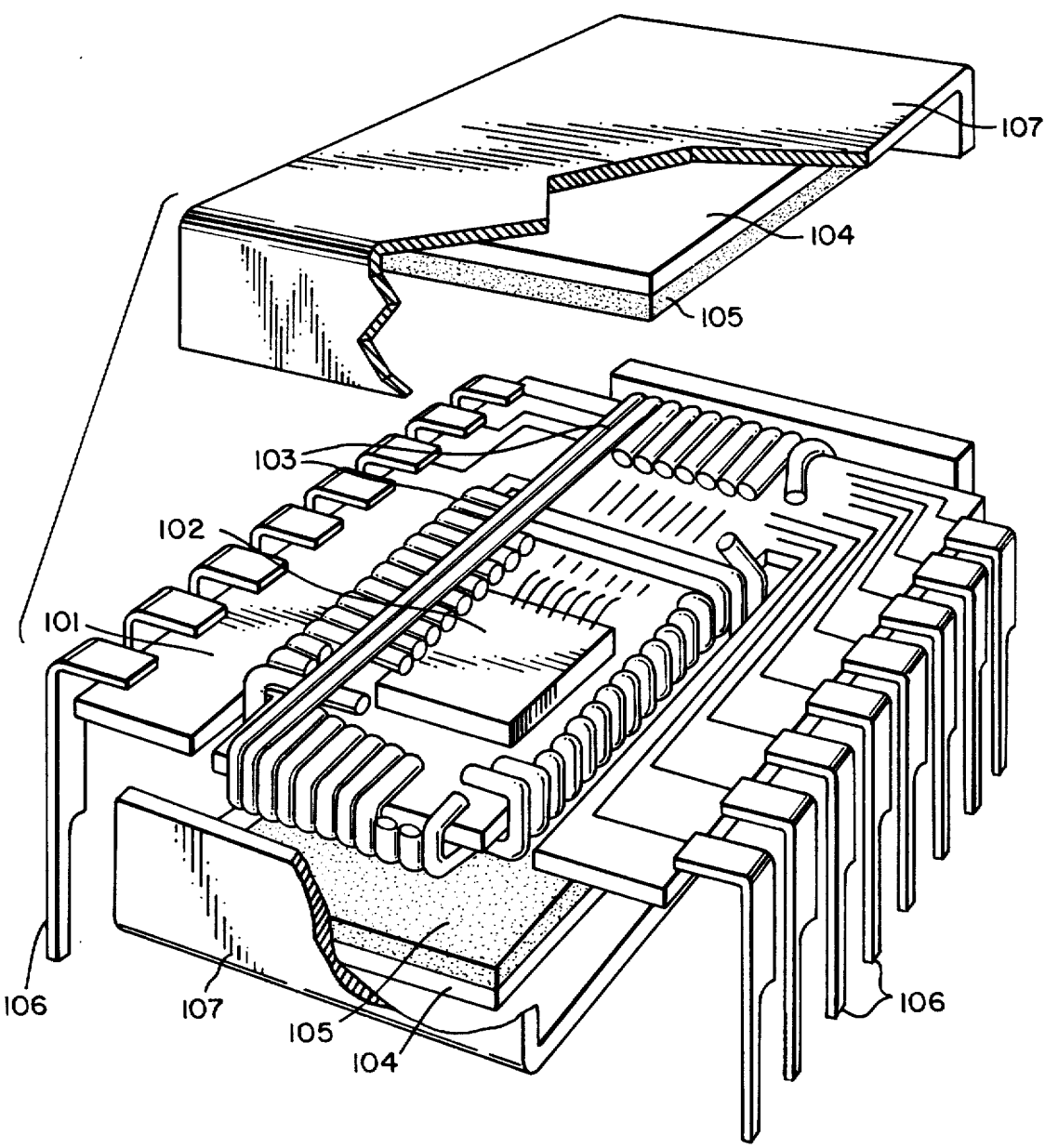
FIG. 1 is a perspective view of a prior art magnetic bubble memory device. illustrating its structure.
Figure 2:
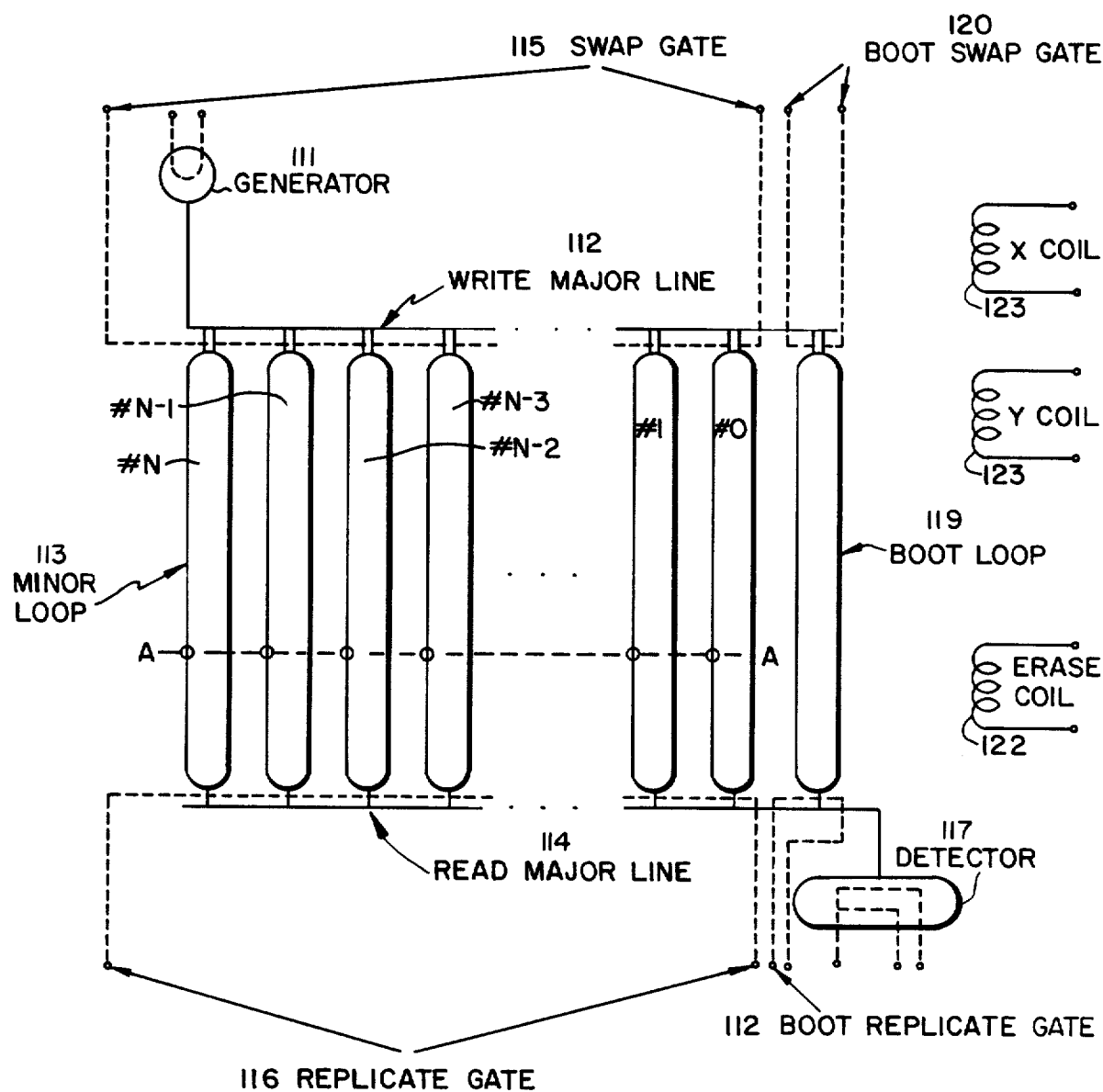
FIG. 2 is a schematic plan view of the prior art magnetic bubble memory device of FIG. 1, illustrating the pattern configuration formed on a garnet substrate.
Figure 3:
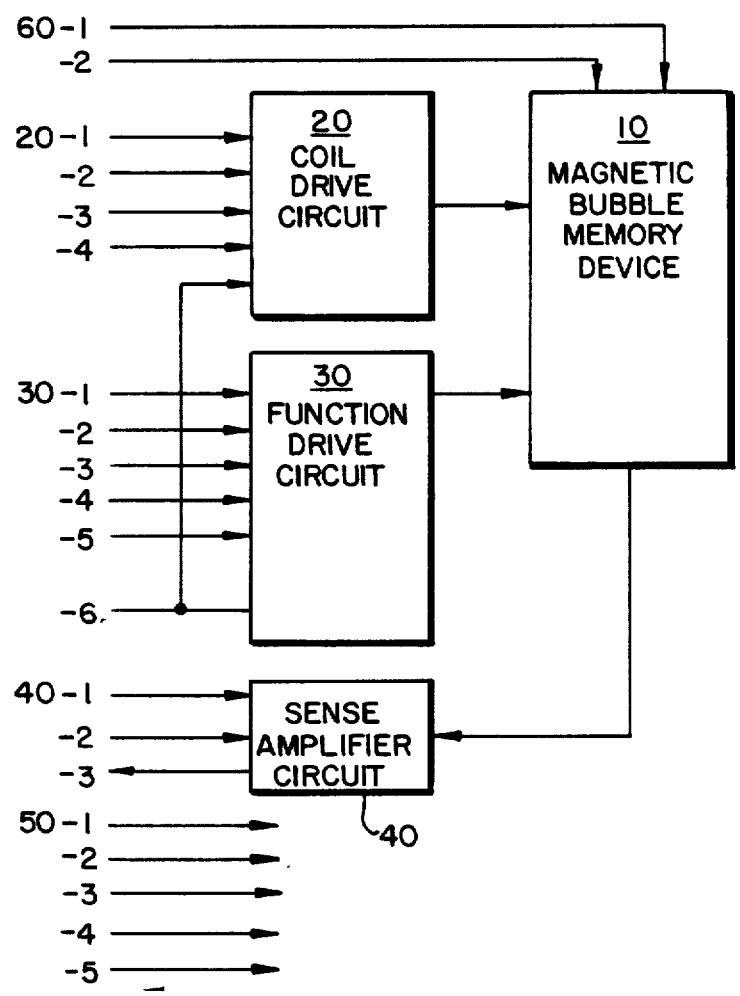
FIG. 3 is a block diagram of the magnetic bubble memory module according to the present invention, illustrating the circuit block configuration and the input/output signals received from or outputted to relevant circuit blocks.

FIG. 3 is a circuit block diagram of a magnetic bubble memory module according to the present invention. The module comprises a magnetic bubble memory device 10, a coil drive circuit 20, a function drive circuit 30 and sense amplifier circuit 40. The X and Y coil drive circuits 20 generate signals of triangular waveform which are supplied to X-Y coil 123 to propagate magnetic bubbles in the magnetic bubble memory chip. The function drive circuit 30 controls the propagation of the magnetic bubbles by feeding respective control signals to various gates of the magnetic bubble memory device such as bubble generator gates (not shown), replicator gates 116 and swap gates 115. The sense amplifier circuit 40 amplifies and converts output signals in the mV-level from a detector 117 of the magnetic bubble memory device 1 to a TTL level, and provides an output to a digital peripheral circuit (shown in FIG. 4). All these devices and circuits described above are conventional ones. Details of the structure and operation of these elements, therefore, will not be described further for the sake of simplicity.

The arrows with reference numerals shown on the left in FIG. 3 indicate various digital signals at the TTL level which are input into the module 1, wherein arrows 20-1 to 20-4 indicate timing signals for the coil drive circuit 20, arrows 30-1 to 30-5 indicate gate timing signals, arrow 30-6 indicates a chip selecting signal, arrow 40-1 indicates a DC reproducing timing signal, and arrow 40-2 indicates a strobe signal. Arrow 40-3 indicates an output signal of the TTL level, which is outputted from the sense amplifier circuit 40 to the digital peripheral circuits. Power supply terminals to the coil drive circuit 20, function drive circuit 30 and sense amplifier circuit 40 are indicated respectively by arrows 50-1 to 50-5, which respectively carry power supply voltages of $+5$ V, $+12$ V, $-12$ V, $-5$ V and 0 V, for example. Arrows 60-1 and 60-2 indicate lead terminals to the erase coil (not shown) of the magnetic bubble memory device 10.

Figure 4:
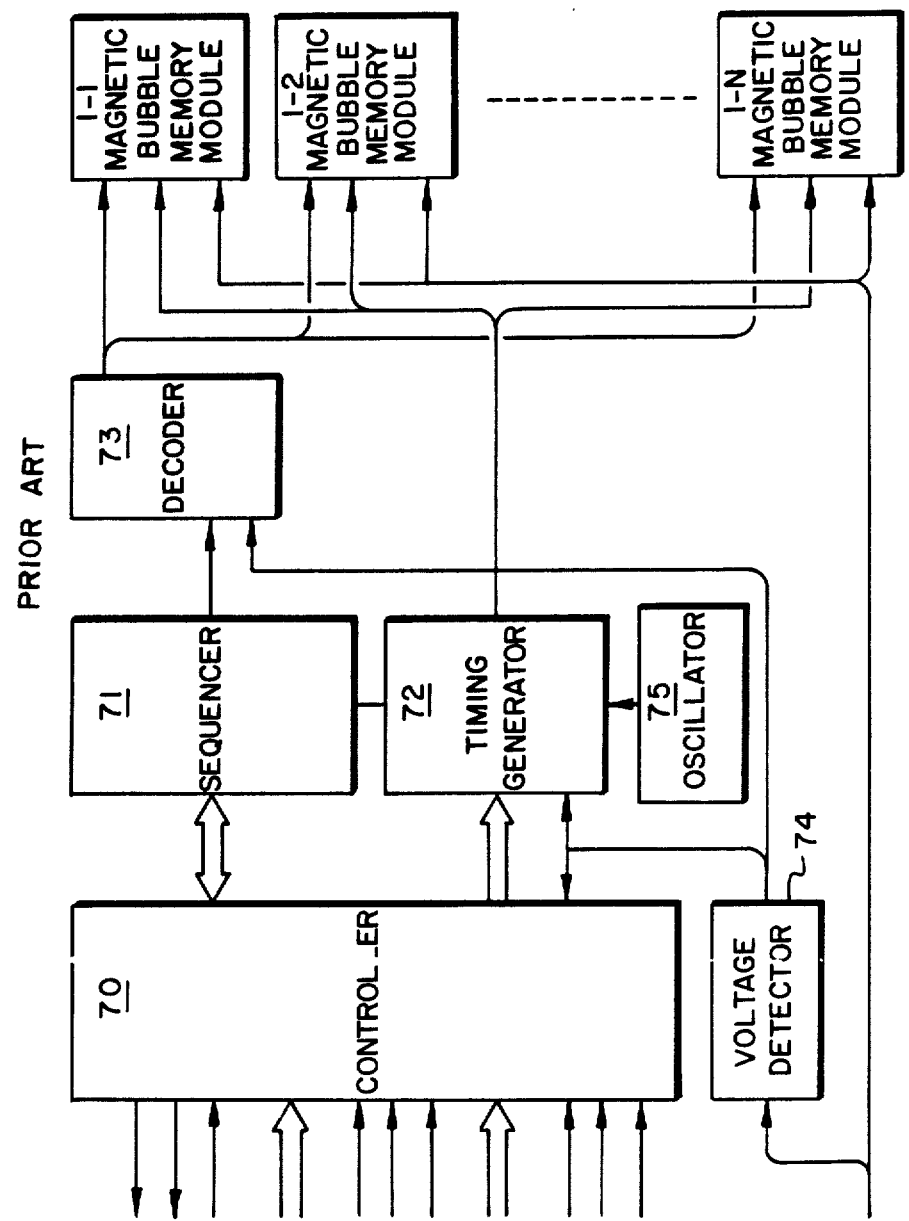
FIG. 4 is a typical circuit block configuration of a magnetic bubble memory apparatus employing magnetic bubble memory modules according to the present invention.

The entire system of the magnetic bubble memory apparatus is illustrated in a block circuit diagram of FIG. 4. The system comprises N of the magnetic bubble memory modules, 1-1 to 1-N, as described above, and their digital peripheral circuits comprising a gate controller 70, a sequencer 71, a timing generator 72, a decoder 73, a voltage detector 74 and an oscillator 75. When write-in or read-out digital signals are fed to the magnetic bubble memory apparatus from a host apparatus, a host computer for instance, the input signals are processed by the digital peripheral circuits to select one of the magnetic bubble memory modules 1-1 to 1-N and to carry out the write-in or read-out operation, resulting in feeding back an outputted sense signal to digital peripheral circuits. These circuits and their operation are conventional ones and well known, about which further description is omitted.

The features of the present invention lies in the mechanical structure of the magnetic bubble memory module comprising magnetic bubble memory devices and relevant analog peripheral circuits. Preferred embodiments are described in detail in the following with reference to the drawings.

Figure 5:
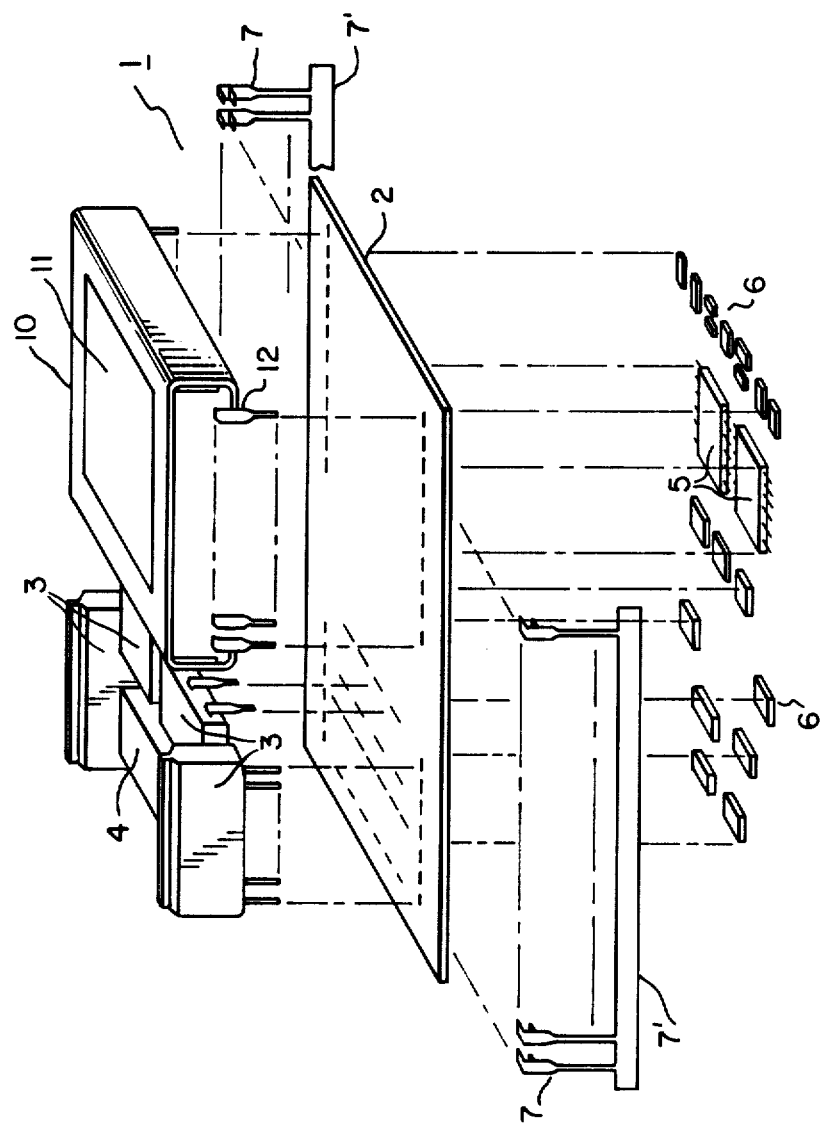
FIG. 5 is a perspective view of a magnetic bubble memory module according to the present invention, illustrating relevant parts for explaining the mounting arrangement.

The first preferred embodiment is illustrated in the perspective view of FIG. 5, showing relevant parts in separated positions. On the front (upper) surface of a substrate 2, which for instance is a multi-layered or bilateral printed circuit board, four ICs 3 for a X-Y coil driver, an IC 4 for a function driver, and a magnetic bubble memory device 10 are mounted, and on the rear surface are mounted two ICs 5 for sense amplifiers and electrical chip elements 6 such as resistors and condensers. The outer lead terminals 7 for mounting the magnetic bubble memory module 1 onto another printed circuit board of another apparatus are arranged in two lines and extend in the direction perpendicular to the surface of the printed circuit board 2. This enables the magnetic bubble memory module 1 to be easily mounted onto a printed circuit board of an electric apparatus. The mounting terminals 7 are usually supplied to a production line in a comb-like ribbon wherein each lead terminal is connected to each other in sequence by a connecting portion 7' which is cut away after fixing the outer lead terminals 7 to the printed circuit board 2.

After mounting the parts described above on the printed circuit board 2, the rear surface of the board 2 is covered by a layer of thermosetting resin which covers all the mounted elements, to protect the elements from heating during the solder mounting operation of the module 1 to another printed circuit board. The parts generating heat, namely, the ICs 3 and 4 for the coil driver and the function driver, are selected to be mounted on the front surface of the printed circuit board 2, so that a relatively large quantity of heat can be dissipated effectively. The magnetic bubble memory device 10 is also mounted on the front surface of the printed circuit board 2, in order to read easily the bad loop ID (identification) label 11 put on the surface of the magnetic bubble memory device 10, indicating the defects contained in the magnetic bubble memory device 10, which information is needed for write-in and read-out operations in the device. Thus, the magnetic bubble memory module 1 described above can be handled as easily as the usual ICs during their mounting onto a printed circuit board.

Figure 6:
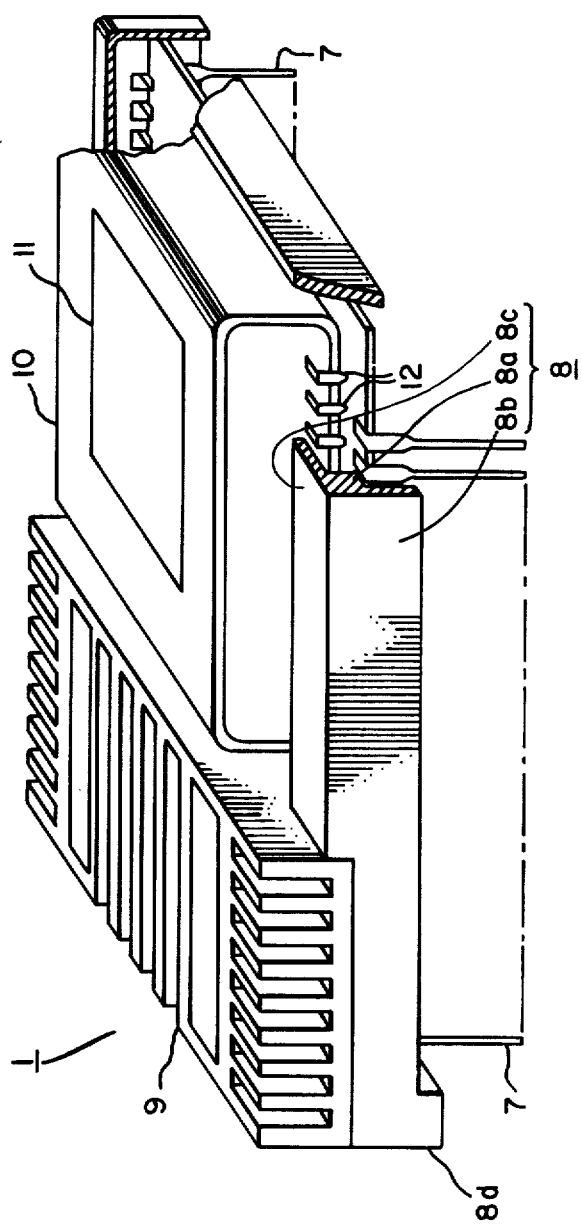
FIG. 6 is a perspective view, including a partial crossectional view of an embodiment of the present invention.
Figure 7:
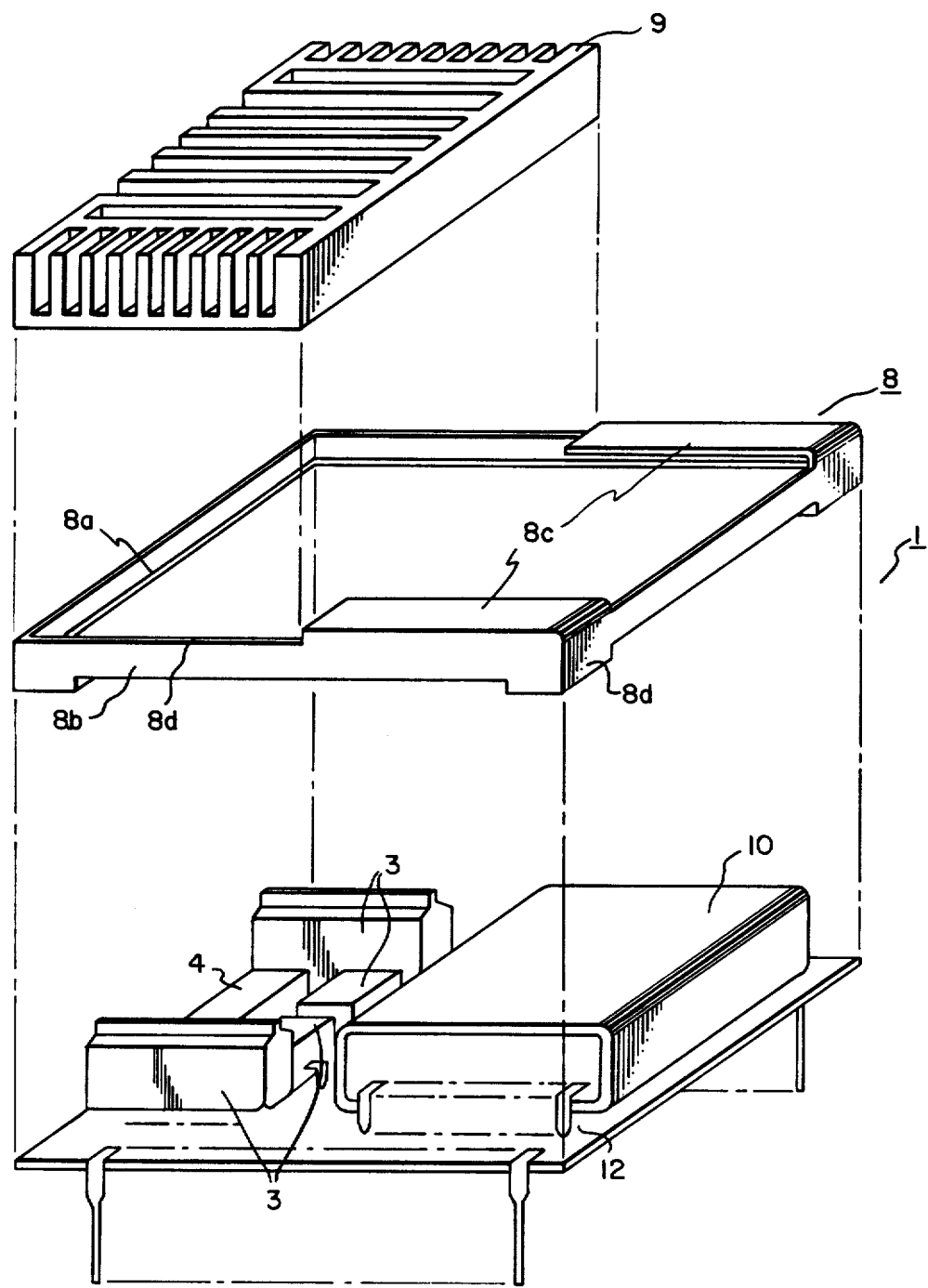
FIG. 7, is a perspective view of the magnetic bubble memory module of FIG. 6, illustrating individual parts to be assembled to form the magnetic bubble memory module.

The second embodiment is illustrated in the perspective views of FIGS. 6 and 7. The plan view, side view and rear view of the second embodiment are illustrated respectively in FIGS. 8A, 8B and 8C. The main parts are illustrated separately in FIG. 7 for displaying the mounting structure. The second embodiment is improved over the first embodiment, by the addition of means for protecting the lead terminals 12 of the magnetic bubble memory device 10, extending from the package of the device 10, from electrostatic discharge damage caused by contact for instance with a human body. As is well known, the human body can store static electrical charge, and, therefore, the human body must not touch the magnetic bubble memory device 10 directly or indirectly through the lead terminals 12, since otherwise the stored information in the form of the magnetic bubbles is damaged. Particularly, in a boot loop of the magnetic bubble memory device 10, information regarding defects contained in the bubble memory chip such as damaged conductor patterns in the minor loops is stored and displayed on a label 11. The defects of the chip must be skipped over when information is written in or read out from the minor loops. Accordingly, if this defect information is damaged, the entire magnetic bubble memory module becomes unavailable. In order to prevent the magnetic bubble memory device from being touched by a human body, such as fingers during mounting of the module to a printed circuit board, a protector of insulator material such as plastic is added to the first embodiment.

An insulative protector 8 is of plastic material such as polybutylene terephthalate (PBT), and has the shape of a rectangular frame as shown in FIG. 7. The protector 8 has abutting surfaces 8a formed by step-like projections on the inner wall of a frame-like portion 8b, inside of which the printed circuit board 2 is accommodated, such as being held by the abutting surface 8a and surrounded tightly by the frame-like portion 8b. The protector 8, and the printed circuit board 2 inserted into the frame-like portion 8b, are inverted and liquid thermosetting resin is poured thereon, the resin is solidified by a subsequent heat treatment to form a thick plastic layer 13, and thus both parts are fixed to each other. The plastic layer 13 on the rear surface of the printed circuit board 2 covers the electrical elements mounted thereon as shown by the hatched portion in the rear view of the module 1 shown in FIG. 8C. The thermosetting resin used is typically a silicon resin. Thus, the printed circuit board is reinforced by the protector 8 and the plastic layer 13. Flange-shaped top-portions 8c are designed to cover the lead terminals 12 of the magnetic bubble memory device 10 so that the lead terminals 12 are prevented from being touched by the fingers of workers. With this structure, the lead terminals 12 are protected completely. Furthermore, the outer wall of the frame-like portion 8b makes it convenient for workers during assembly to carry the module 1 with their fingers or tools thereon. In addition, lift-off projections 8d are formed on the bottom edge of the frame-like portion 8b for mounting the module 10 onto a printed circuit board by dip soldering. As is wellknown, the lift-off projections help to keep a gap between the bottom of the mounted device and the printed circuit board, which is helpful for removing residual chemicals used for cleaning after dip-soldering.

The protector 8 serves to support the total weight of the magnetic bubble memory module 1 when mounted on printed circuit boards. The module 1 is rather heavy because of the drive coils and bias magnets involved. Accordingly, the structure supporting the module 1 by the frame-like portion 8b and lift-off projections 8d of the protector 8 is effective to provide the magnetic bubble memory apparatus with a more vibration-resistive structure, and to reduce the mechanical loads otherwise applied to the outer lead terminals 7.

Figure 8C:
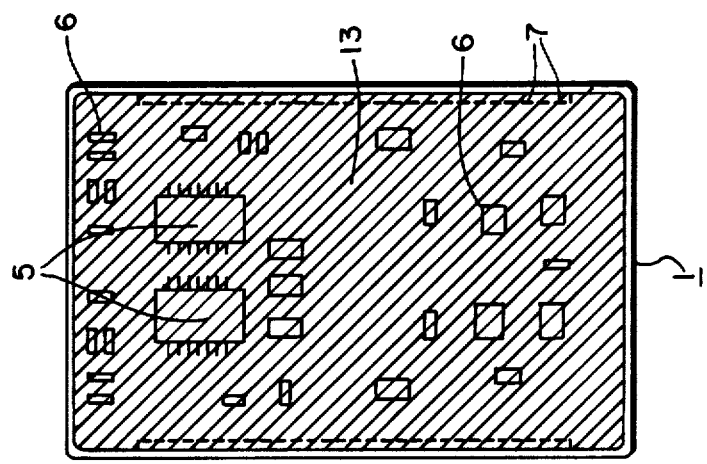
FIG. 8C is a rear view of the magnetic bubble memory module of FIG. 6.
Figure 8B:
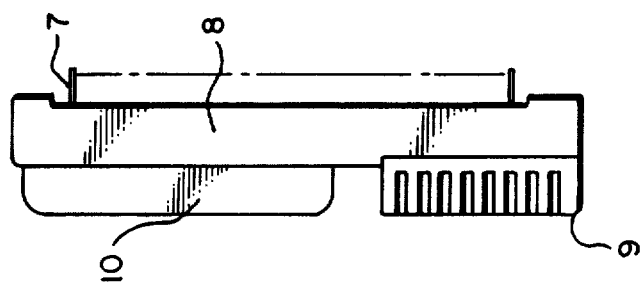
FIG. 8B is a side view of the magnetic bubble memory module of FIG. 6.
Figure 8A:
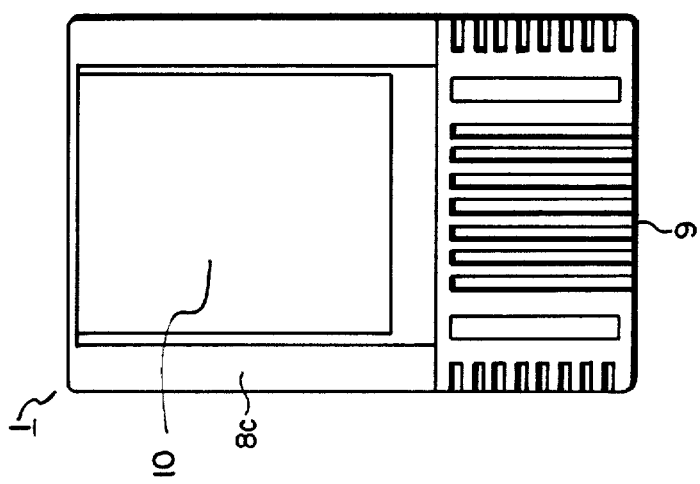
FIG. 8A is a front view of the magnetic bubble memory module of FIG. 6.

In addition, a heat sink 9 is added to the first embodiments for increasing the dissipation of heat generated in ICs 3 and 4 as shown in FIGS. 6, 7 and 8. The heat sink 9 is placed over the ICs 3 and 4 and a liquid thermosetting resin having a high heat conductivity is filled therebetween. The resin is solidified by heat treatment, to form a heat conductive layer to take the heat to the heat sink 9 for dissipation. The heat sink 9 is positioned by the aid of the insulator protector 8. The heat sink 9 is of aluminum that is coated to be black, and has dissipation fins formed thereon as shown in FIGS. 6 to 8C. The heat sink 9 can reduce the temperature rise of the IC's 3 and 4 to approximately 40° C. In addition, the heat sink 9 serves to increase the mechanical strength or rigidity of the printed circuit board 2, namely, of the magnetic bubble memory module 1.

Figure 9:
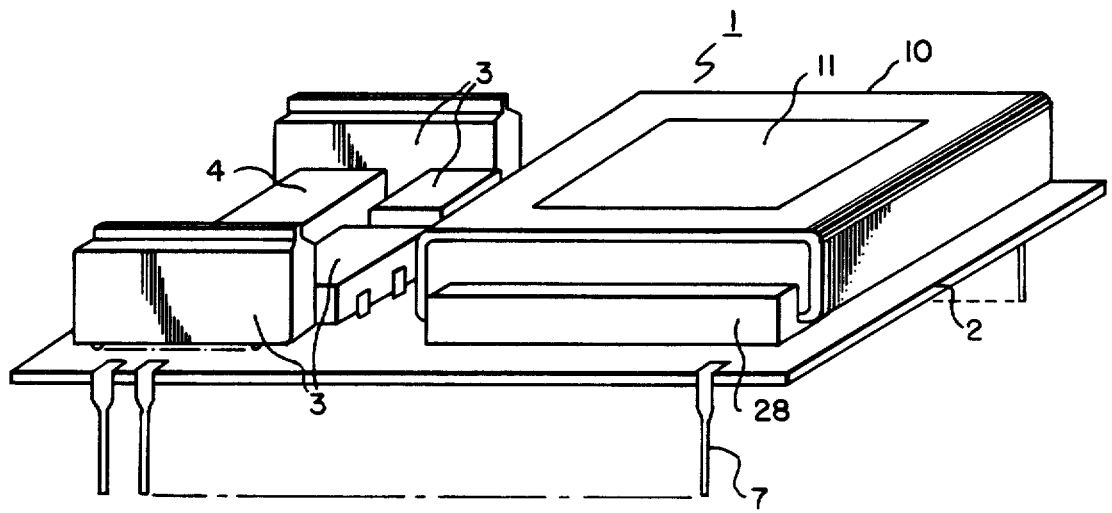
FIG. 9 is a perspective view of another embodiment of the present invention.
Figure 10:
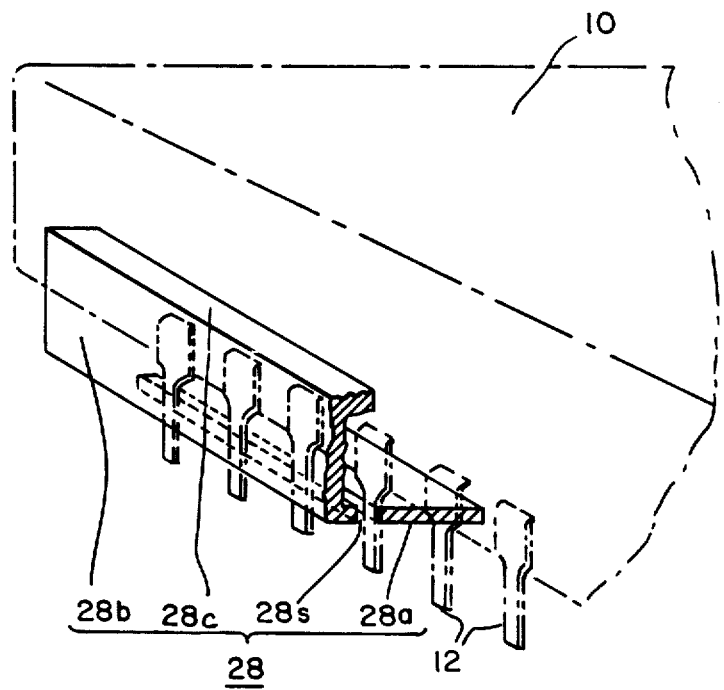
FIG. 10, is a magnified perspective view of a protector used in the magnetic bubble memory module of FIG. 9, illustrating the mounting of the magnetic bubble memory module onto a printed circuit board so as to protect the lead terminals of the magnetic bubble memory device.

The third embodiment is a simplified modification of the second embodiment, as shown in a perspective view of FIG. 9. Small, simple, molded plastic protectors 28 are placed to cover the lead terminals 12 of the magnetic bubble memory device 10. FIG. 10 is a perspective view of the detailed structure of the protector 28, illustrating the method for mounting the protector 28 on the substrate 2 of the magnetic bubble memory module 1. The protector 28 has an L-type cross-section, comprising the base portion 28a, the protection wall 28b and the top flange 28c. In the base portion 28a, a long slit 28s is formed in the longitudinal direction having a length and width sufficient to allow the line of lead terminals 12 of the magnetic bubble memory device 10 to pass therethrough. Thus the protectors 28 can be fixed to the printed circuit board 2 of the module 1, by passing the lead terminals 12 through the slit 28s beforehand, inserting the lead terminals 12 into the through-holes (not shown) of the printed circuit board 2, and fixing the terminals 12 to the printed circuit board 2 by a conventional dip-soldering method. As a result, the lead terminals 12 of the magnetic bubble memory device 10 are prevented from touching a charged body by means of the protectors 28. Of course, it is obvious to those skilled in the art that the shape, the structure, or the mounting method of the protector for the lead terminals of the magnetic bubble memory device can have various modifications, and that the features of the present invention are not limited by the third embodiment described above.

What we claim is as follows:

1. A magnetic bubble memory module comprising:
a magnetic bubble memory device having a plurality of lead terminals extending therefrom;
a plurality of analog peripheral circuits for driving and controlling said magnetic bubble memory device;
a plurality of outer lead terminals for receiving input signals for said analog peripheral circuits and for sending output signals from said analog peripheral circuits;
a substrate on the top surface of which said magnetic bubble memory device, analog peripheral circuits and outer lead terminals are mounted; and
protection means of insulative material for protecting said lead terminals of said magnetic bubble memory device from electrostatic discharge damage caused by contact with a charged body, said protection means comprising a frame-like portion having an inner wall with a step-like portion and an abutting surface on said step-like portion, said substrate being inserted inside said frame-like portion and supported by said step-like portion in contact with said abutting surface, and being fixed rigidly to said frame-like portion of said protection means.

2. The module of claim 1, wherein said insulative material is a plastic material.

3. The module of claim 1, wherein said substrate comprises a printed circuit board having wiring areas on both top and bottom surfaces thereof.

4. The module of claim 1, wherein said magnetic bubble memory device has terminals which extend perpendicularly to and through slots in said substrate, for fastening said magnetic bubble memory device to said substrate.

5. The module of claim 1, wherein said outer lead terminals include respective parts located between said abutting surface of said frame-like portion of said protecting means and the top surface of said substrate, and further parts located between the edge of said substrate and the inner surface of said frame-like portion of said protecting means adjacent said step-like portion.

6. The module of claim 1, wherein at least one group of said lead terminals of said magnetic bubble memory device is arranged in a plane, and said protection means comprises a respective protection portion extending over each said group of said lead terminals.

7. The module of claim 6, said protective portion comprising a base portion with a slit through which said respective group of lead terminals extends, said protection means being thereby fixed to said substrate.

8. The module of claim 1, wherein said plurality of analog peripheral circuits comprise a coil driver circuit block and a function driver circuit block for said magnetic bubble memory device mounted on the top surface of said substrate, and a sense amplifier circuit block mounted on the bottom surface of said substrate.

9. The module of claim 8, wherein a heat sink is attached to said circuit blocks of said coil and function drivers by heat conductive adhesive material.

10. The module of claim 1, wherein a plastic adhesion material is used to rigidly fix said substrate to said frame-like portion.

11. The module of claim 10, said plastic adhesion material being on the opposite side of said substrate from the top surface on which said magnetic bubble memory device is mounted.

12. The module of claim 11, at least one of said protection means and said plastic adhesion material reinforcing said substrate.

* * * * *

UNITED STATES PATENT AND TRADEMARK OFFICE
CERTIFICATE OF CORRECTION

PATENT NO. : 4,710,895

DATED : December 1, 1987

INVENTOR(S) : MAEGAWA et al.

It is certified that error appears in the above-identified patent and that said Letters Patent is hereby corrected as shown below:

Col. 1, line 34, change "wellknown" to --well-known--;

line 38, after "comprises" insert --a--;

line 50, after "referred" insert --to--.

Col. 4, line 20, after "7" delete --,--;

line 32, after "10" delete --,--.

Col. 7, line 2, change "wellknown" to --well-known--.

Signed and Sealed this

Twenty-eighth Day of June, 1988

Attest:

DONALD J. QUIGG

Attesting Officer

Commissioner of Patents and Trademarks